United States Patent
Yoshida

(10) Patent No.: US 6,805,903 B2
(45) Date of Patent: Oct. 19, 2004

(54) METHOD OF FORMING OPTICAL THIN FILM

(75) Inventor: Kunio Yoshida, Osaka (JP)

(73) Assignee: Japan Science and Technology Corporation, Kawaguchi (JP)

( * ) Notice: Subject to any disclaimer, the term of this patent is extended or adjusted under 35 U.S.C. 154(b) by 0 days.

(21) Appl. No.: 10/362,361

(22) PCT Filed: Aug. 29, 2001

(86) PCT No.: PCT/JP01/07407

§ 371 (c)(1),
(2), (4) Date: Aug. 1, 2003

(87) PCT Pub. No.: WO02/18981

PCT Pub. Date: Mar. 7, 2002

(65) Prior Publication Data

US 2004/0027700 A1 Feb. 12, 2004

(30) Foreign Application Priority Data

Aug. 29, 2000 (JP) ........................................ 2000-258877

(51) Int. Cl.7 ............................. G02B 1/11; B05D 5/06; B05D 3/10
(52) U.S. Cl. ....................... 427/166; 427/165; 427/167; 427/245; 427/255.15; 427/255.7; 427/264; 427/273; 427/353; 359/580; 359/582
(58) Field of Search ............................. 427/162, 163.1, 427/163.2, 164, 165, 166, 167, 243, 244, 245, 255.15, 255.7, 258, 261, 264, 270, 271, 273, 333, 336, 352, 353; 359/580, 581, 582; 216/24

(56) References Cited

U.S. PATENT DOCUMENTS

| | | | | |
|---|---|---|---|---|
| 3,497,425 A | * | 2/1970 | Cotton et al. | 205/170 |
| 5,572,086 A | * | 11/1996 | Tong et al. | 313/478 |
| 6,605,229 B2 | * | 8/2003 | Steiner et al. | 216/24 |

FOREIGN PATENT DOCUMENTS

| | | |
|---|---|---|
| JP | 61-170702 | 8/1986 |
| JP | 61-119102 | 7/1988 |
| JP | 6-167601 | 6/1994 |

* cited by examiner

*Primary Examiner*—Shrive P. Beck
*Assistant Examiner*—Wesley D. Markham
(74) *Attorney, Agent, or Firm*—Oblon, Spivak, McClelland, Maier & Neustadt, P.C.

(57) ABSTRACT

A method for forming an optical thin film used for optical elements of laser systems including high-energy lasers and an optical element of optical apparatuses is provided. The optical thin film can be easily formed on a desired substrate with reproducibility by vapor-depositing a porous fluoride layer for preventing reflection in the deep ultraviolet region, and can be easily removed in a short time to reuse the substrate if the thin film damaged. A water-insoluble material (2) for preventing reflection is vapor-deposited onto an optical element substrate (1). A water-soluble material (3) having a higher particle energy is vapor-deposited onto the surface of the water-insoluble material (2). The water-soluble material (3) permeates deep into the water-insoluble material (2) to form a mixed film on the surface of the substrate (1). Then, the water-soluble material (3) is dissolved and removed to form a porous thin film (5) comprising the water-insoluble material (2).

8 Claims, 3 Drawing Sheets

(a)

(b)

METHOD OF FORMING OPTICAL THIN FILM

TECHNICAL FIELD

The present invention relates to a method for forming an optical thin film used as an antireflection film of an optical element used for high-energy lasers, a thin film for enhancing the laser resistance of polarizers and reflectors used for high-energy lasers, and an antireflection film formed on an eye-protection filter for lessening screen glare of a display.

BACKGROUND ART

Methods for forming the optical thin film are roughly classified into vapor deposition and chemical processes.

Antireflection films formed by vapor deposition include monolayer films and multilayered films. The monolayer film is formed by vapor-depositing, on a substrate, a material having a refractive index lower than that of the substrate at a thickness of one fourth a wavelength. In the multilayered film, at least two layers are vapor-deposited using materials having a high refractive index and a low refractive index.

The inventors of the present invention have proposed a method using both the vapor deposition and a chemical process. In this method, a water-soluble material and a water-insoluble material are vapor-deposited at one time onto a substrate to form a mixed film, and then the water-soluble material is removed from the mixed film to form a porous thin film comprising the water-insoluble material.

The method for forming the porous thin film has been disclosed in Japanese Patent Application Publication No. 5-52923.

Milam and others of Lawrence Livermore National Laboratory in the U.S. have developed a method for forming an antireflection film using a chemical process and in which a porous silica thin film having a reflectance of 0.1% to 0.3% is formed on the surface of a quartz glass substrate by a sol-gel process. This method has been disclosed in D. Milam et al., CLEO'84 Technical Digest, THB 2 (1984).

Thomas of the same laboratory has formed porous $MgF_2$ and $CaF_2$ fluoride thin films on quartz glass and $CaF_2$ crystal substrates by a sol-gel process. This method for forming the porous $MgF_2$ and $CaF_2$ films has been disclosed in Ian M. Thomas, Appl. Opt., Vol. 27, No. 16, pp. 3356–3358 (1988).

DISCLOSURE OF INVENTION

However, these methods described above have the following problems.

Optical films formed by the known vapor deposition are less resistant to laser treatment. In addition, it is very difficult to form an antireflection film for ArF and $F_2$ lasers having emission wavelengths of 193 nm and 157 nm, respectively, which are deep ultraviolet light used for lithography, because, in order to form a broadband antireflection film, at least three layers must be vapor-deposited.

Furthermore, once a film is damaged, the substrate having the damaged film needs to be restored through two processes, rough polishing and ultra-fine polishing.

This is because the film formed by the known vapor deposition locally has, between the surface of the substrate and the deposited thin film, an absorption layer which cannot be removed by ultrasonic cleaning or laser cleaning, that is, laser light exposure, and because the remaining absorption layer is turned into plasma by a high-energy laser light to destruct the deposited film.

A broadband antireflection film is formed by vapor-depositing two materials having a high refractive index and a low refractive index in 3 to 7 layers, or by depositing two materials in 100 to 300 layers each having a thickness of one hundredth to one three hundredth that of a monolayer film. However, these methods increase manufacturing costs in comparison with a method for forming a monolayer film.

Also, when a damaged film is removed from a substrate to reuse the substrate, it takes at least about 5 hours to restore the substrate because of the two polishing processes.

The method proposed by the inventors, using the mixed film and the chemical process to form a porous thin film whose refractive index has a gradient is applicable to oxide, but the method is difficult to apply to fluoride. In addition, two materials must be vapor-deposited while the mixing ratio of the materials is varied in the process of forming the mixed film. However, this makes it difficult to control the deposition rate and thus makes it difficult to steadily obtain a desired reflectance.

The porous $MgF_2$ and $CaF_2$ films formed by the sol-gel processes proposed by Milam or Thomas have a reflectance of 0.5% or less at a predetermined wavelength and a laser resistance two or more times than that of a thin film formed by vapor deposition. However, the surfaces thereof undesirably exhibit a low mechanical strength.

This is because the porous thin films are formed of colloidal particles adhered onto the surface of a substrate by Van der Waals force and therefore easily peel if an external mechanical force is applied to the thin film.

Accordingly, the present invention is intended to solve these problems and the object of the present invention is to provide a method for forming an optical thin film used as an optical element used for laser systems including high-energy lasers and an optical element used for optical apparatuses. The optical film has a high laser resistance and a reasonable hardness at the surface thereof, and can be used with a desired refractive index gradient in a broad wavelength band from deep ultraviolet to infrared. In particular, the method provides a porous fluoride thin film for preventing reflection in a deep ultraviolet region, easily vapor-deposited on a desired substrate with good reproductively. Also, the thin film can be easily removed to reuse the substrate if the film is damaged.

In order to achieve the object, the present invention provides the following:

(1) A method for forming an optical thin film comprises the steps of: vapor-depositing a water-insoluble material for preventing reflection onto an optical element substrate; vapor-depositing a water-soluble material having a higher particle energy onto the surface of the water-insoluble material; allowing the water-soluble material to permeate deep into the water-insoluble material to form a mixed film on the surface of the substrate; and subsequently dissolving and removing the water-soluble material to form a porous thin film comprising the water-insoluble material.

(2) In the method for forming an optical thin film described in (1), the optical element substrate comprises one material selected from the group consisting of: optical glasses including quartz glass, borosilicate crown glass, and phosphate glass; crystals including fluorite, rock crystal, and sapphire; laser crystals including YAG and $Al_2O_3$; ceramics; semiconductors; plastics; and metals.

(3) In the method for forming an optical thin film described in (1), the water-insoluble material comprises one compound selected from the group consisting of: oxides including silica; and fluorides including magnesium fluoride.

(4) In the method for forming an optical thin film described in (3), the oxides and the fluorides consist of $SiO_2$, $Al_2O_3$, $CeO_2$, $HfO_2$, $Ta_2O_5$, $ThO_2$, $TiO_2$, $ZrO_2$, $Sc_2O_3$, $MgF_2$, $AlF_3$, $CaF_2$, $LiF$, $LaF_3$, $PbF_2$, and $NdF_3$.

(5) In the method for forming an optical thin film described in (1), the water-soluble material comprises one compound selected from the group consisting of fluorides, oxides, chlorides, and phosphates.

(6) In the method for forming an optical thin film described in (5), the fluorides, the oxides, the chlorides, and the phosphates consist of NaF, $Na_3AlF_6$, LiF, $B_2O_3$, $MgCl_2$, NaCl, $NiCl_2$, $LaCl_3$, LiCl, and $NaPO_3$.

(7) The method for forming an optical thin film described in (1) further comprises the step of forming an overcoat film on the surface of the porous thin film.

(8) In the method for forming an optical thin film described in (7), the overcoat film comprises a fluoride or an oxide and is 50 to 500 Å in thickness.

BEST MODE FOR CARRYING OUT THE INVENTION

The embodiment of the present invention will now be illustrated in detail.

Figure 1:
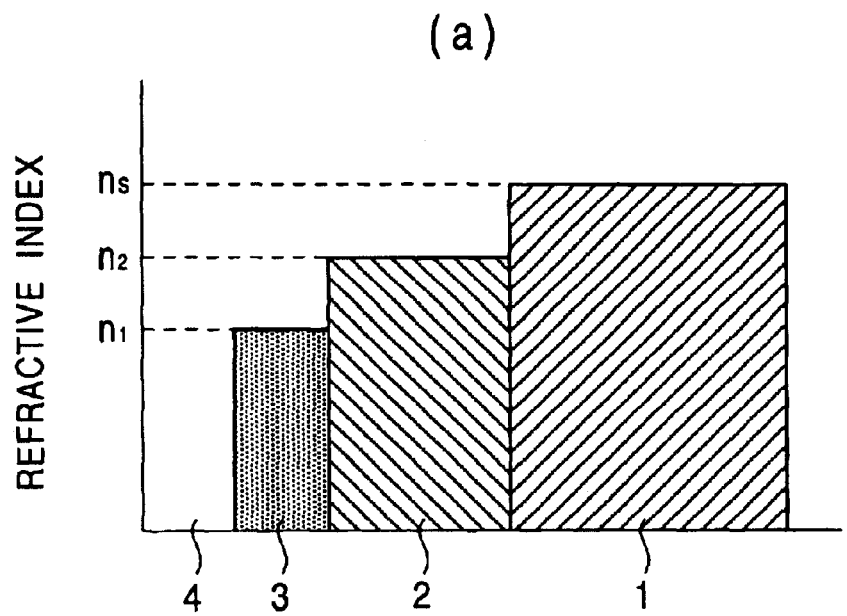
FIG. 1 is a schematic illustration showing a method for forming an optical thin film according to the present invention.
Figure 1:
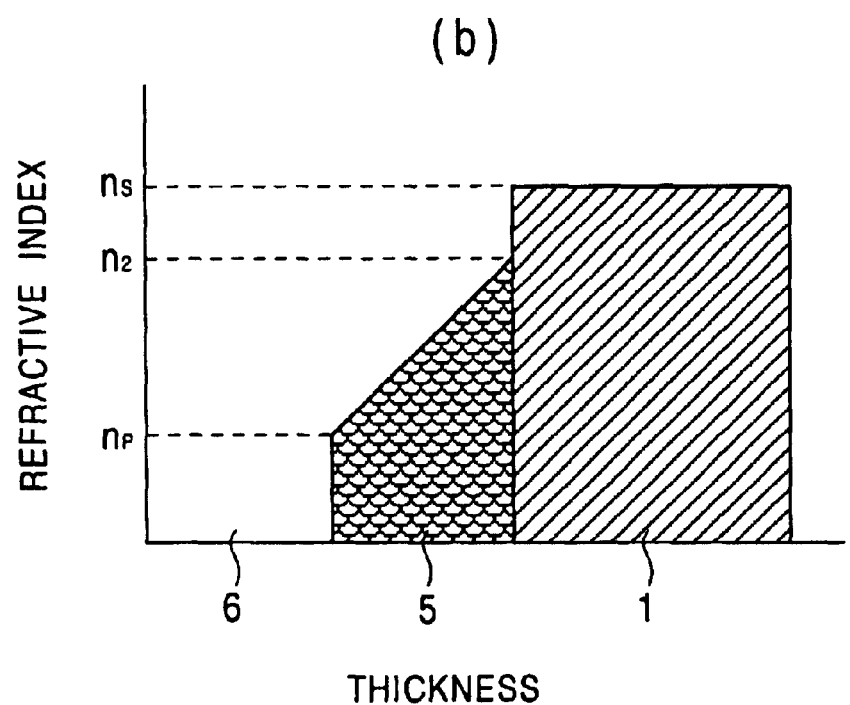

FIG. 1 is a schematic illustration showing a method for forming an optical thin film according to the present invention.

First, as shown in FIG. 1(a), a water-insoluble material 2 for preventing reflection is vapor-deposited onto the surface of an optical element substrate 1, and then a water-soluble material 3 is vapor-deposited which includes energetic particles capable of permeating into the first water-insoluble layer in a sufficient amount to form a mixed film on the optical element substrate 1. Reference numeral 4 designates an air space. Referring to FIG. 1(b), the water-soluble material 3 in the mixed film is removed to form a porous thin film 5 of the water-insoluble material on the optical element substrate 1. Reference numeral 6 designates an air space.

The water-insoluble material deposited to form the mixed film may be an oxide, such as silica ($SiO_2$), or a fluoride, such as magnesium fluoride ($MgF_2$), and the water-soluble material may be a fluoride, such as sodium fluoride (NaF), an oxide, a chloride, or a phosphate. But, instead of those materials, other materials having the same function may be used. Such water-insoluble materials include $Al_2O_3$, $CeO_2$, $HfO_2$, $Ta_2O_5$, $ThO_2$, $TiO_2$, $ZrO_2$, $Sc_2O_3$, $MgF_2$, $AlF_3$, $CaF_2$, LiF, $LaF_3$, $PbF_2$, and $NdF_3$, and such water-soluble materials include $Na_3AlF_6$, LiF, $B_2O_3$, $MgCl_2$, NaCl, $NiCl_2$, $LaCl_3$, LiCl, and $NaPO_3$.

The optical element substrate 1 is generally formed of an optical glass, such as quartz glass, borosilicate crown glass (BK-7), and phosphate glass. Alternatively, crystals such as fluorite ($CaF_2$), rock crystal ($SiO_2$), and sapphire ($AlO_3$), laser crystals such as YAG and $Al_2O_3$, ceramics, semiconductors, plastics, and metals may be used.

Also, the vapor deposition includes vacuum deposition, sputtering, ion plating, chemical vapor deposition, and their combinations. However, it is important that the deposition apparatus and technique used here are designed to allow the water-soluble material to permeate deep into the water-insoluble layer.

The water-soluble material in the deposited mixed film, constituted of the above-described material, such as NaF, and $Na_3AlF_6$, is easily removed using pure water or ultra-pure water, and thus the remaining water-insoluble $SiO_2$, $MgF_2$, or the like forms a porous thin film 5 having a refractive index gradient on the substrate 1.

The refractive index $n_p$ and refractive index gradient of the resulting porous thin film 5 at the air space 6 side can be changed by varying the amount and depth of the water-soluble material 3 permeating into the water-insoluble material 2.

Characters $n_1$, $n_2$, and $n_s$ in FIG. 1(a) designate the refractive index of the water-soluble layer 3, the refractive index of the water-insoluble layer 2, and the refractive index of the substrate 1, respectively; and character $n_p$ in FIG. 1(b) designates the refractive index of a thin layer between the air space 6 and the porous thin film 5.

The optical thickness of the porous thin film is defined by the product of the refractive index and thickness of the porous thin film and is set at one fourth of a specific wavelength, that is, $\lambda/4$ ($\lambda$: the wavelength of specific incident light).

When the refractive index of the porous thin film 5 is set lower than that of the substrate 1 and the optical thickness is set at an odd number time of $\lambda/4$, the resulting antireflection film has a smallest reflectance for specific incident light. Also, the porous thin film is nonuniform film having a refractive index gradient. Therefore, the resulting antireflection film can be used in a highly broad wavelength band from deep ultraviolet to infrared.

Also, the reflectance of the porous thin film 5 can be much reduced in comparison with that of a thin film formed by conventional vacuum deposition.

For example, the refractive index of a uniform monolayer thin film formed by conventional vacuum deposition is no less than about 1.38, and, in this instance, the reflectance of this film in combination with a quartz glass substrate is 1.8%. In contrast, the porous thin film 5 according to the present invention has a reflectance as small as 0.25%, as shown in the embodiment.

In this connection, the reflectance of the porous thin film according to the present invention is expressed by the following equations.

Reflectance $R_1$ of vertical incident light when only the water-insoluble material 2 is vapor-deposited at a thickness of one fourth the wavelength on a substrate in FIG. 1(a) is expressed by equation (1):

$$R_1 = \left(\frac{n_2^2 - n_s}{n_2^2 + n_s}\right)^2 \quad (1)$$

Reflectance $R_p$ in the case where there is a refractive index gradient, as shown in FIG. 1(b), is expressed by:

$$R_P \approx 1 - \frac{4n_p n_2 n_s}{[n_p n_g + n_s]^2 - [n_p^2 - 1][n_s^2 - n_2^2]\sin^2(\theta/2)} \quad \text{where} \quad (2)$$

-continued $$\theta = \frac{4\pi}{\lambda} \int_0^{d_p} n(z) dz \approx \frac{2\pi}{\lambda} [n_p + n_2] d_p$$

$\lambda$ and $d_p$ represent the light wavelength and the thickness of the porous thin film, respectively.

A first example of the present invention will now be described.

$MgF_2$ was vapor-deposited at a thickness of about 60 nm onto the surface of a quartz glass substrate having a diameter of 40 mm which was not heated, by resistance heating. Next, the pressure of the deposition bath was set at 0.7 mTorr by introducing argon gas, and subsequently NaF was deposited at a thickness of 20 nm on the $MgF_2$ layer by ion plating, followed by heating at 200° C. for 10 minutes.

Figure 2:
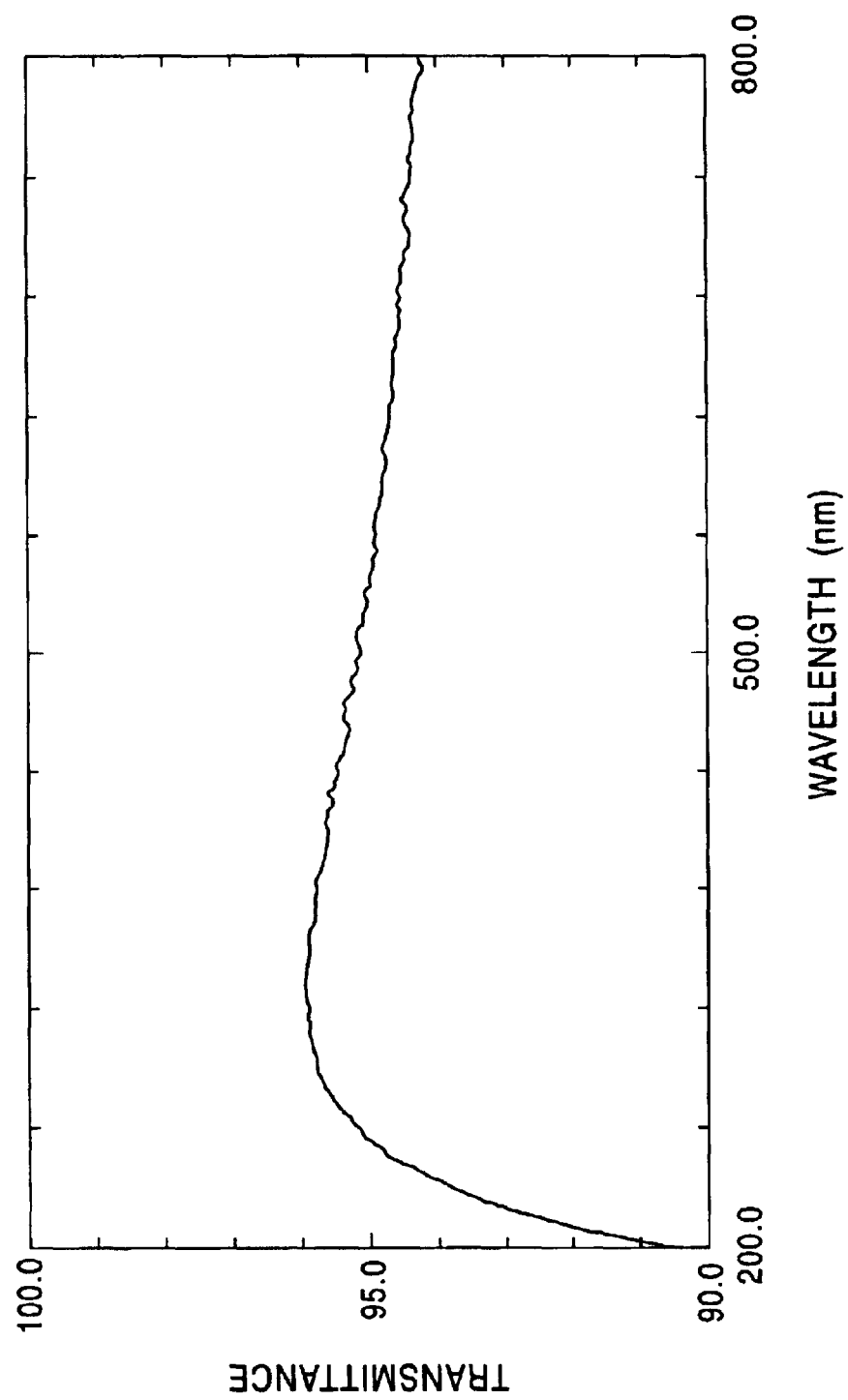
FIG. 2 is a graph showing the transmittance of an optical thin film according to the present invention with respect to wavelengths.

The resulting two-layered film was immersed in ultra-pure water of 25° C. for 1 minute to remove the NaF layer. FIG. 2 shows the changes in transmittance of the resulting porous $MgF_2$ thin film formed on one surface of the quartz glass substrate.

The reflectance of the porous $MgF_2$ thin film was 0.25% at a wavelength of 332 nm. For information, the reflectance of the surface of the quartz substrate is 3.75% at the wavelength of 332 nm, and the reflectance in the case where $MgF_2$ is deposited on the quartz glass substrate at a thickness of one fourth the wavelength is 1.8%. Hence, the reflectance of the porous thin film is reduced to about one seventh the reflectance of a common $MgF_2$ monolayer film. The surface roughness of the porous $MgF_2$ film was 12 Å (RMS) As for stress, while the tensile stress of a mixed film is 483 kgf/cm$^2$, the stress of the porous $MgF_2$ thin film from which NaF was removed by immersing the film in ultra-pure water was extremely reduced to 48 kgf/cm$^2$. The mechanical strength of the film surface is about twice that of a metal thin film; hence there is no problem in practice.

A second example of the present invention will now be described.

$SiO_2$ was vapor-deposited at a thickness of about 68 nm onto the surface of a quartz glass substrate having a diameter of 40 mm which was not heated, by an electron beam technique. Then, a porous $SiO_2$ film was formed on one surface of the quartz glass substrate in an identical manner to the first example. The reflectance of the resulting porous $SiO_2$ film was 0.5% at a wavelength of 370 nm. This film had a surface roughness of 10 Å (RMS) and a mechanical strength as large as that of the porous $MgF_2$ film.

A third example of the present invention will now be described.

A porous $MgF_2$ film was formed to a thickness of 48 nm on the surface of a $CaF_2$ crystal substrate having a diameter of 40 mm, in an identical manner to the first example. The reflectance of this film was 0.8% at a wavelength of 270 nm. While the reflectance of the $CaF_2$ crystal substrate is 3.57% at the wavelength of 270 nm, the reflectance in the case where $MgF_2$ is vapor-deposited on the $CaF_2$ substrate at a thickness of one fourth the wavelength is 2%. Hence, the reflectance of the porous $MgF_2$ film on the $CaF_2$ substrate was reduced to about 1/2.5 the reflectance of a conventional $MgF_2$ monolayer film.

A fourth example of the present invention will now be described.

First, a $MgF_2$ layer, acting as the water-insoluble material, was vapor-deposited onto a quartz glass substrate having a diameter of 40 mm, and a $Na_3AlF_6$ layer was formed to a thickness of 20 nm on the $MgF_2$ layer by ion plating. After heating the substrate as in the first example, $Na_3AlF_6$ was removed using ultra-pure water to form a porous $MgF_2$ thin film. The optical and mechanical performances of the resulting thin film were as great as those in the first example.

A fifth example of the present invention will now be described.

The porous $MgF_2$ film formed in the first example was optically polished with a planetary grinder using a $CeO_2$ suspension. As a result, the substrate was able to be restored to have an ultra-smooth surface in a short period of time as little as about 10 minutes without being damaged. A new porous $MgF_2$ film can be formed again on the surface of the restored substrate, and the optical performance did not changed.

FIG. 2 shows that the porous $MgF_2$ film has a reflectance of 0.25% at the wavelength of 332 nm and, thus, can prevent reflection in a broad wavelength band.

A sixth example of the present invention will now be described.

Figure 3:
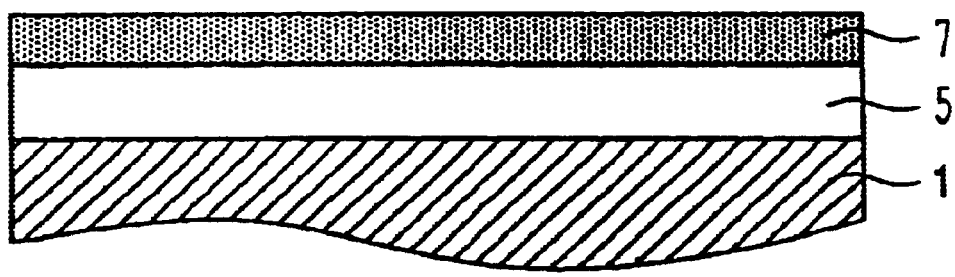
FIG. 3 is a sectional view of an overcoated optical thin film according to a sixth example of the present invention.

FIG. 3 is a sectional view of an optical thin film of a sixth example in which the surface of a porous thin film formed in the foregoing examples is overcoated.

In this drawing, reference numbers 1, 5, and 7 designate a glass substrate, the above-described porous thin film formed on the substrate 1, and an overcoat film formed on the porous thin film 5, respectively.

A fluoride layer (such as a $MgF_2$ layer) or an oxide layer (such as a $SiO_2$ layer) was overcoated at a thickness of 50 to 500 Å on the porous thin film 5 on the glass substrate 1. Overcoating may be performed by resistance heating, electron beam heating, ion beam sputtering, or the like.

As a result, a porous thin film covered with the overcoat film used for a wavelength of 266 nm was obtained.

While a simple porous thin film has a reflectance of, for example, 0.25% at a wavelength of 200 nm, the porous thin film on which $MgF_2$ layer having a thickness of about 80 Å was overcoated had a reflectance of 0.2% at a wavelength of 266 nm. By overcoating a film, the thickness was increased and, consequently, the wavelength at which the transmittance becomes maximum (the reflectance is minimum) was shifted toward the longer wavelength side, from 200 to 266 nm.

The mechanical strength was also enhanced to a degree substantially equivalent to the strength of conventional thin films.

Also, the deterioration with time (deterioration with age) of the reflectance can be suppressed.

For example, (1) the reflectance of a simple porous thin film (for 266 nm) is 0.25% before use, and is changed to about 1.2% after one year has elapsed. In contrast, (2) the reflectance of the overcoated porous thin film (for 266 nm) is 0.2% before use, and is only slightly changed to about 0.4% even after one year has elapsed. Thus the deterioration with age can be suppressed.

By forming an overcoat film on the surface of the porous thin film, three properties of the resulting film, that is, the mechanical strength, the deterioration of the film reflectance with age, and the film reflectance, can be improved.

Since the porous thin film is porous and hence has a low density, it has a refractive index gradient. Consequently, it can easily be an antireflection film even if it is a monolayer film. However, the density of the porous thin film gradually increases and thus the reflectance disadvantageously increases because the porous thin film has many pores (the pore size is the same as that of molecules) into which water or particles (dust) in the air having a size of molecules are trapped. However, according to the present example, this disadvantage can be overcome.

The present invention is not limited to the above-described examples, and various modifications may be made according to the spirit of the invention, without departing from the scope of the invention.

As described above in detail, the present invention has the following advantages.

(1) By removing the second layer, or the water-soluble material, a porous thin film having a refractive index gradient can be easily formed and, thus, an antireflection film having an extremely small reflectance can be achieved which could not be obtained by the known vacuum deposition.

(2) By changing the first layer material, or the water-insoluble material containing oxide or fluoride, various optical thin films having various refractive index gradients can be formed with good reproducibility. Thus an optical thin film having small reflectance in a broad wavelength band from deep ultraviolet to infrared can be achieved which could not be obtained in a monolayer film formed by the known vacuum deposition.

(3) The pores of the porous thin film prevent laser exposure from increasing the pressure of the absorption material in the thin film and thus prevent the laser exposure from damaging the optical thin film. As a result, the resulting thin film has a laser resistance and thus can be used for a high-energy leaser.

(4) Since the adhesion of the porous thin film to the substrate is lower than that of a conventional hardly coated optical thin film, a damaged thin film can be easily removed using an optical polishing liquid containing ultrafine particles suspended, in a short period of time without affecting the surface of the substrate.

(5) By forming an overcoat film on the surface of the porous thin film, three properties of the resulting film, that is, the mechanical strength, the deterioration of the film reflectance with age, and the film reflectance, can be improved.

Industrial Applicability

The resulting optical thin film of the present invention is suitably used for an optical element of laser systems including high-energy lasers, an optical element of optical apparatuses, such as digital cameras, video cameras, and liquid crystal projectors, and a protective film for solar cells, pictures, and displays.

What is claimed is:

1. A method for forming an optical thin film, comprising the steps of:

(a) vapor-depositing a water-insoluble material for preventing reflection onto an optical element substrate;

(b) vapor-depositing a water-soluble material having a higher particle energy onto the surface of the water-insoluble material;

(c) allowing the water-soluble material to permeate deep into the water-insoluble material to form a mixed film on the surface of the substrate; and (d) subsequently dissolving and removing the water-soluble material to form a porous thin film comprising the water-insoluble material.

2. A method for forming an optical thin film according to claim 1, wherein the optical element substrate comprises one material selected from the group consisting of: optical glasses including quartz glass, borosilicate crown glass, and phosphate glass; crystals including fluorite, rock crystal, and sapphire; laser crystals including YAG and $Al_2O_3$; ceramics; semiconductors; plastics; and metals.

3. A method for forming an optical thin film according to claim 1, wherein the water-insoluble material comprises one compound selected from the group consisting of: oxides including silica; and fluorides including magnesium fluoride.

4. A method for forming an optical thin film according to claim 3, wherein the oxides and the fluorides consist of $SiO_2$, $Al_2O_3$, $CeO_2$, $HfO_2$, $Ta_2O_5$, $ThO_2$, $TiO_2$, $ZrO_2$, $Sc_2O_3$, $MgF_2$, $AlF_3$, $CaF_2$, LiF, $LaF_3$, $PbF_2$, and $NdF_3$.

5. A method for forming an optical thin film according to claim 1, wherein the water-soluble material comprises one compound selected from the group consisting of fluorides, oxides, chlorides, and phosphates.

6. A method for forming an optical thin film according to claim 5, wherein the fluorides, the oxides, the chlorides, and the phosphates consist of NaF, $Na_3AlF_6$, LiF, $B_2O_3$, $MgCl_2$, NaCl, $NiCl_2$, $LaCl_3$, LiCl, and $NaPO_3$.

7. A method for forming an optical thin film according to claim 1, further comprising the step of forming an overcoat film on the surface of the porous thin film.

8. A method for forming an optical thin film according to claim 7, wherein the overcoat film comprises a fluoride or an oxide and is 50 to 500 Å in thickness.

* * * * *